United States Patent [19]

Donuma et al.

[11] Patent Number: 4,539,476
[45] Date of Patent: Sep. 3, 1985

[54] MODULE FOR A FIBER OPTIC LINK

[75] Inventors: Kenichi Donuma, Koshigaya; Makoto Ohashi, Kawasaki; Takeshi Ozeki, Tokyo, all of Japan

[73] Assignee: Tokyo Shibaura Denki Kabushiki Kaisha, Kawasaki, Japan

[21] Appl. No.: 610,171

[22] Filed: May 14, 1984

Related U.S. Application Data

[63] Continuation of Ser. No. 325,485, Nov. 27, 1981.

[30] Foreign Application Priority Data

Nov. 28, 1980 [JP] Japan ................. 55-166684
Nov. 28, 1980 [JP] Japan ................. 55-166685
Nov. 28, 1980 [JP] Japan ................. 55-166688

[51] Int. Cl.$^3$ ........................................ G02B 5/14
[52] U.S. Cl. ........................ 250/227; 350/96.18; 350/96.20
[58] Field of Search ............. 350/96.15, 96.17, 96.18, 350/96.20; 250/227, 551; 357/16, 17

[56] References Cited

U.S. PATENT DOCUMENTS

| | | | |
|---|---|---|---|
| 3,806,225 | 4/1974 | Codrino | 350/96.20 |
| 4,127,862 | 11/1978 | Ilegems et al. | 357/16 |
| 4,136,357 | 1/1979 | Fredericksen | 357/30 |
| 4,173,389 | 11/1979 | Curtis | 350/96.20 |
| 4,186,995 | 2/1980 | Schumacher | 350/96.18 |
| 4,188,708 | 2/1980 | Frederiksen | 350/96.15 |
| 4,199,222 | 4/1980 | Ikushima et al. | 350/96.18 |
| 4,268,756 | 5/1981 | Crouse et al. | 250/551 |
| 4,273,413 | 6/1981 | Bendiksen et al. | 350/96.20 |
| 4,339,689 | 7/1982 | Yamanaka et al. | 357/17 |
| 4,355,321 | 10/1982 | Yeats | 350/96.18 |
| 4,427,879 | 1/1984 | Becher et al. | 250/551 |

*Primary Examiner*—David C. Nelms
*Assistant Examiner*—J. Jon Brophy
*Attorney, Agent, or Firm*—Cushman, Darby & Cushman

[57] ABSTRACT

A module for a fiber optic link has a case housing a circuit module plate. An optoelectric element mounted at a predetermined position of lead frames is molded from a transparent transfer molding material. The case has a socket for mounting a fiber cable connector which is molded from a nontransparent injection molding material. A hole in which is inserted a plug of the connector is formed in the socket and the case. The optoelectric element is arranged to oppose the hole of the case through a convex lens segment of the case.

12 Claims, 12 Drawing Figures

MODULE FOR A FIBER OPTIC LINK

This is a continuation, of application Ser. No. 325,485, filed Nov. 27, 1981.

BACKGROUND OF THE INVENTION

The present invention relates to a module for a fiber optic link and, more particularly, to a transmitter and receiver module for a fiber optic link.

In a fiber optic link, an optical signal generated in a transmitter module is guided to an optical fiber cable, is transmitted through the fiber cable, and is detected in a receiver module to be converted into an electric signal. In a fiber optic link of this type, optical coupling between the fiber cable and the receiver and transmitter modules, is important. In other words, it is required that an optical axis of an optoelectronic element in the module, that is, a photodiode in the receiver module or an LED (Light Emitting Diode) in the transmitter module, be aligned with the optical axis at the end face of the optical fiber of the fiber cable in a precise manner, for example, within an error allowance of several to several tens of microns. In a conventional fiber optic link, an LED or photodiode as a single component is assembled in the transmitter module or in the receiver module. For this reason, the alignment of these electrical components and the optical fiber is not easy, and it is difficult to satisfactorily improve the light transmitting efficiency.

SUMMARY OF THE INVENTION

It is an object of the present invention to provide a module for a fiber optic link wherein an optical axis at the end face of an optical fiber may be aligned with an optical axis of an optoelectronic element in the module with high precision by simply mounting the optical fiber cable.

It is another object of the present invention to provide a module for a fiber optic link suitable for mass production.

In order to achieve the above and other ends, the present invention provides a module comprised of first and second members. The first member is obtained by being molded into a predetermined shape. An optoelectronic element is embedded at a predetermined position of the first member. The optoelectronic element is connected to leads which extend outward from the first member. The first member is housed within the second member. The optoelectronic element of the first member is located to oppose the opening of a hole inside the second member which defines the optical path.

The first member is preferably manufactured by transfer molding, and the second member is preferably manufactured by injection molding.

DETAILED DESCRIPTION OF THE PREFERRED EMBODIMENTS

Figure 1:
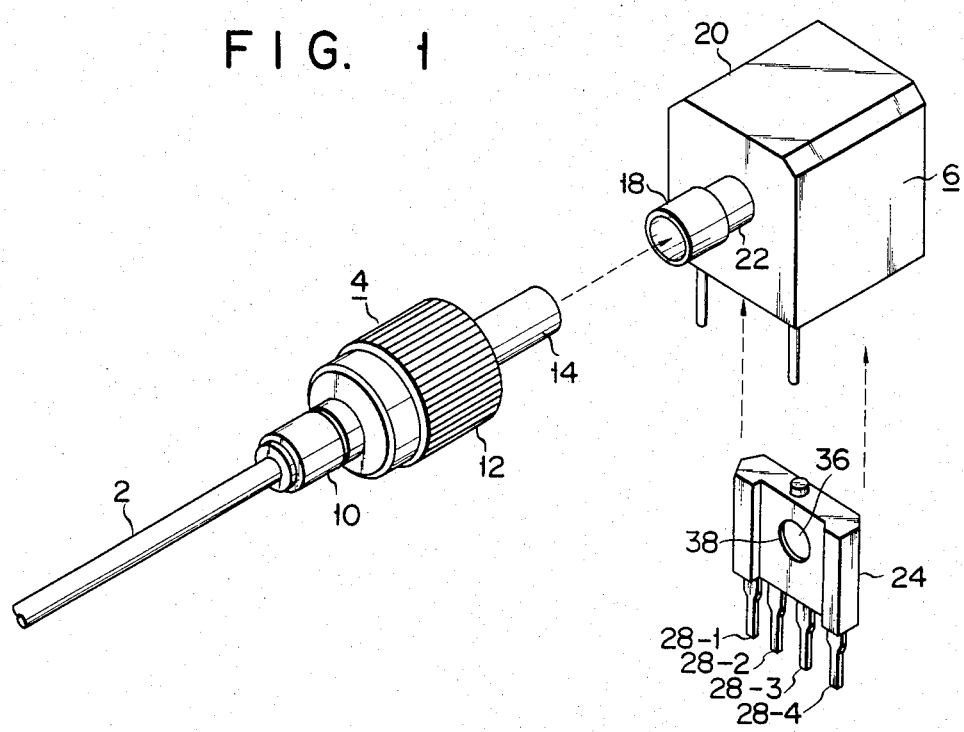
FIG. 1 is a perspective view showing a fiber optic link including a module according to an embodiment of the present invention.

FIG. 1 shows the receiver side of a fiber optic link. The receiver side includes an optical fiber cable 2, a connector 4 fixed to one end of the fiber cable 2, and a module (receiver module) 6 to which is mounted the connector 4. Although not shown, the transmitter side of the fiber optic link is of substantially the same structure as that of the receiver side. The internal structure of the module is also the same for both the transmitter and receiver sides except for the circuit elements and optoelectronic element assembled in each module. Therefore, although the description will be made only with reference to the module, it is to be understood that the module refers both to the receiver module and the transmitter module.

Figure 2:
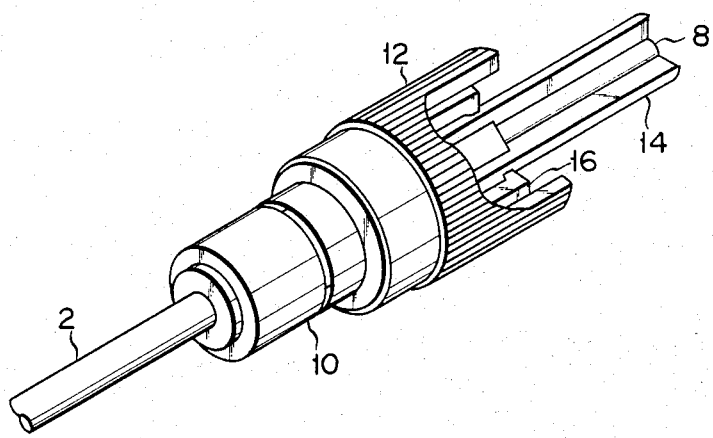
FIG. 2 is a partially cut away perspective view showing the connector of FIG. 1.
Figure 3:
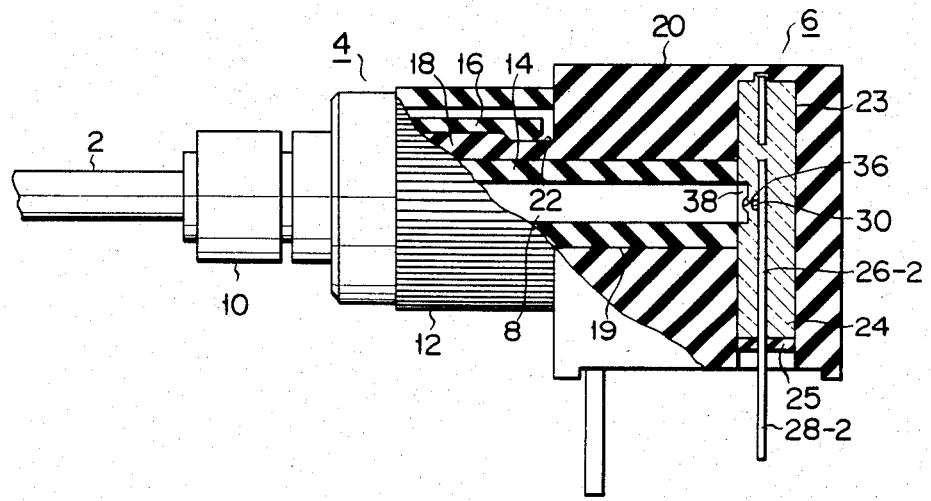
FIG. 3 is a partially sectional view showing the module and the connector shown in FIG. 1 under the coupled condition.
Figure 4:
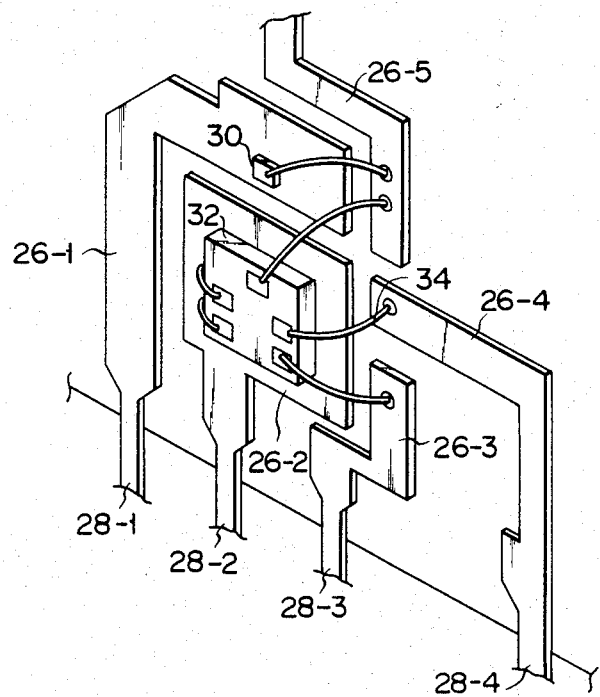
FIG. 4 is a perspective view showing the internal structure of the circuit plate shown in FIGS. 1 and 3.

The optical fiber cable 2 is obtained in a generally known method by covering a plastic or glass optical fiber 8 comprising a core and a cladding with a flexible light-shielding material. The connector 4 is manufactured by injection molding. As shown in FIG. 2, the optical fiber cable 2 is fixed to a fixing section 10 of the connector 4. The optical fiber cable 2 further extends inside a cylindrical rigid plug 14 coaxially projecting from the fixing section 10 and terminates at the front end of the plug 14. A snap piece 16 is arranged inside a knurled section 12. A cylindrical socket 18 projects from a main body case 20 to correspond with the cylindrical rigid plug 14. The inner diameter of the socket 18 is set to be substantially equal to or slightly greater than the outer diameter of the plug 14. The outer diameter of the socket 18 is also set to be slightly greater than a distance between projections of the snap pieces 16 facing each other. As shown in FIG. 3, a stepped section 22 is formed at the socket 18 so as to engage with the snap piece of the connector 4 when the connector 4 is mounted to the socket 18. The hole 19 of the socket 18 in which is inserted the plug 14 communicates with a space 23 which extends inside the main body case 20 and in which circuit plate 24 is inserted. As will be described later, the module 6 is manufactured by injection molding as in the case of the connector 4. In contrast with this, the circuit plate 24 is manufactured by transfer molding. The receiver module 6 and the connector 4 are made of a light-shielding material which does not transmit light, while the circuit module plate 24 is made of a transparent resin. As shown in FIG. 4, within the circuit plate 24 are embedded five Ag-plated lead frames 26-1, 26-2, 26-3, 26-4 and 26-5. The lead frame 26-5 extends to and terminates at one side of the plate 24, while the other lead frames 26-1, 26-2, 26-3 and 26-4 extend to the outside the plate 24 at the other side and terminate into pins 28-1, 28-2, 28-3 and 28-4. On the lead frame 26-1 is mounted through a conductive paste an optoelectric element 30, an LED pellet in the case of the transmitter module and a photodiode in the case of the receiver module. On the lead frame 26-2 is mounted through a conductive paste a circuit element corresponding to the optoelectronic element 30, that is, an IC chip 32 in which a circuit, for example an amplifier, a comparator and related components or a driver circuit for the LED is formed. The bonding pads of the optoelectric element 30, the IC chip 32 and the lead frames 26-1, 26-2, 26-3, 26-4, and 26-5 are electrically connected through gold bonding wires 34. The optoelectronic element 30 is embedded at a predetermined position of the plate 24 so that the optoelectronic element 30 opposes the hole 19 of the socket 18 and is aligned with the central axis of the hole 19, when the circuit plate 24 is mounted within the main body case 20 of the module 6. A convex lens segment 36 for converging or diverging a light beam is formed at the region of the plate 24 where the optoelectronic element 30 is embedded, as shown in FIG. 3. This convex lens segment 36 is formed within a recess 38 on the plate 24 so as not to contact the optoptical fiber 8. When the circuit module plate 24 is housed within the main body case 20, the optical axis of the convex lens segment 36 and the optoelectronic element 30 is aligned with the central axis of the socket 18. The plate 24 is fixed to the main body case 20 with an adhesive 25, thus completing the module 6, that is, the receiver module or the transmitter module.

Figure 5:
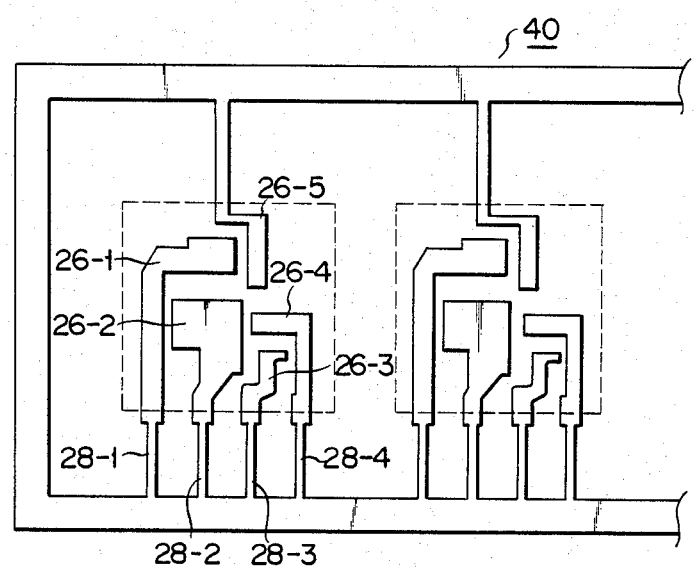
FIG. 5 is a plan view showing a frame for manufacturing the circuit plate shown in FIGS. 1 and 3.

The method for manufacturing the module 6 as described above will now be described. Prior to the formation of the circuit plate 24, a copper plate is punched into a desired shape and is Ag-plated to provide a frame 40 as shown in FIG. 5. Next, the IC chip 32 and the optoelectronic element 30, that is, the LED or the photodiode, are mounted on the lead frames 26-1 and 26-2 with a conductive paste to be electrically connected thereto. The optoelectronic element 30 is connected to the lead frame 26-5 with a gold bonding wire having a diameter of 25 μm. The bonding pads of the IC chip 32 are respectively connected to the lead frames 26-2, 26-3, 26-4, and 26-5 with the bonding wires. The frame 40 with the IC chip 32 and the optoelectronic element 30 is mounted in a pair of dies (not shown) defining a cavity conforming to the outer shape of the circuit plate 24, as shown in FIGS. 1 and 3. Into this cavity defined by these dies is transferred a transparent thermosetting resin, for example, a transparent thermosetting epoxy resin MP-8500 manufactured by Nitto Denshi-kogyo K.K., under certain conditions, for example, at a temperature of 160° C. and a pressure of 30 kg/cm². After curing, the plate shown in FIG. 1 and FIG. 3 is completed.

As has been described above, the plate 24 obtained by transfer molding is prepared, and the case 20 of the module 6 for housing it is obtained by injection molding. Dies defining a recess conforming to the outer shape of the case 20 as shown in FIG. 1 and dies having an outer shape conforming to the outer shape of the hole of the socket 18 and the circuit module plate 24 are combined to define a cavity into which is injected a light-shielding thermosetting epoxy resin, for example, a black thermosetting epoxy resin EME-155F manufactured by Sumitomo Bakelite K.K., under certain conditions, for example, a temperature of 165° C. and a pressure of 80 kg/cm². Thus the case 20 is completed after curing.

The completed plate 24 is inserted in a recess of the case 20 for mounting the plate, as shown in FIG. 1. The plate 24 is fixed to the case 20 with an adhesive 25. The dies for molding the case 20 and the dies for molding the circuit plate 24 are manufactured in advance taking into consideration the expansion or shrinkage of the resin materials upon curing in the transfer molding process. Therefore, the plate 24 fits inside the case 20 relatively well. When the plate 24 is mounted to the case 20, the optical axis of the optoelectronic element 30 of the circuit module plate 24 is aligned with the central axis of the hole of the case 20.

The connector 4 is coupled to the module 6 obtained in this manner, as shown in FIG. 3. When the front end of the plug 14 inserted in the hole of the socket 18 shown in FIGS. 1 and 3 contacts the surface of the circuit module plate 24, the projection of the snap piece 16 engages with the stepped section 22 of the socket 18, completing the mounting. During this process, since the central axis of the hole of the socket 18 is aligned with the optical axis of the optical fiber 8 inserted and fixed inside the plug 14, the optical axis of the optical fiber 8 is substantially aligned with the optical axis of the optoelectronic element 30. Furthermore, since the convex lens segment 36 is formed inside the recess 38 of the plate 24 and the front end of the plug 14 contacts the surface of the plate, the positioning of the plug is easy. The deformation of the optical fiber 8 due to contact with the convex lens segment 36 is prevented. Since the case 20 is manufactured by injection molding, the case 20 is resistant to abrasion and mechanical force. Since substantially no flashes are formed in the case 20 in injection molding, the case 20 may be molded with high precision. Since the circuit module plate 24 is manufactured by transfer molding, mass production is facilitated and smaller size may be attained. Therefore, the module 6 itself may be made compact in size.

Figure 6:
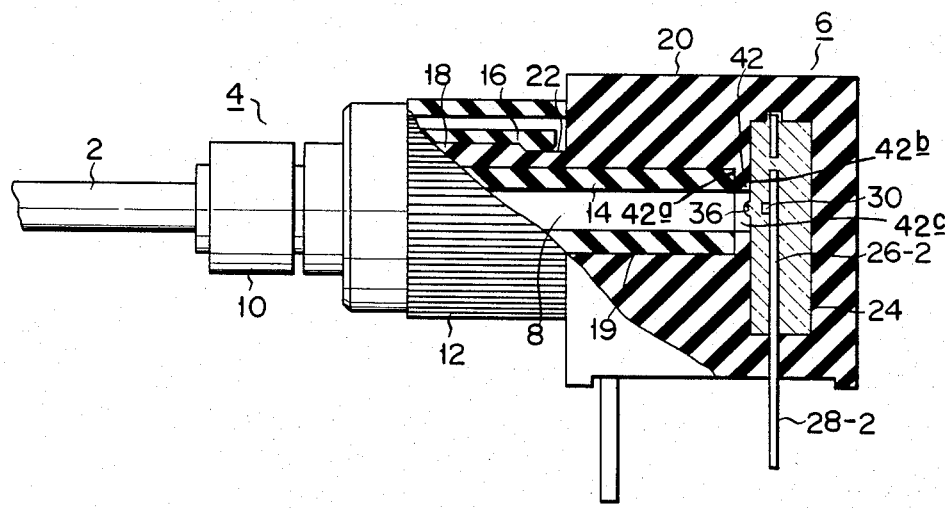
FIGS. 6, 7, 8, 9, 10 and 11 are sectional views showing modules according to other embodiments of the present invention.
Figure 7:
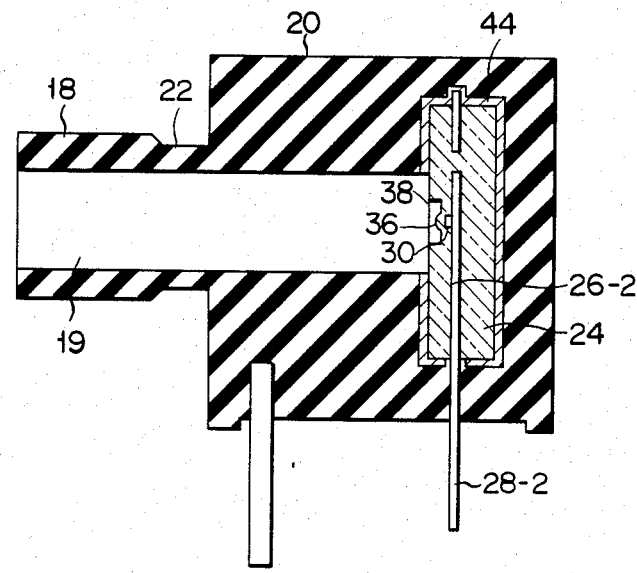
Figure 8:
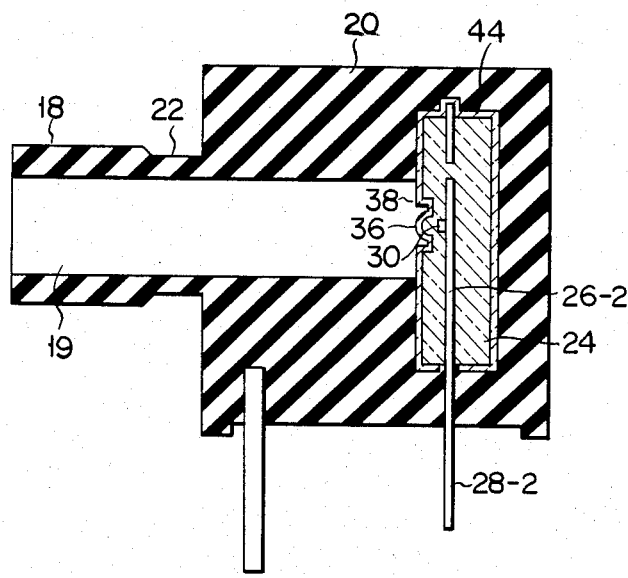
Figure 9:
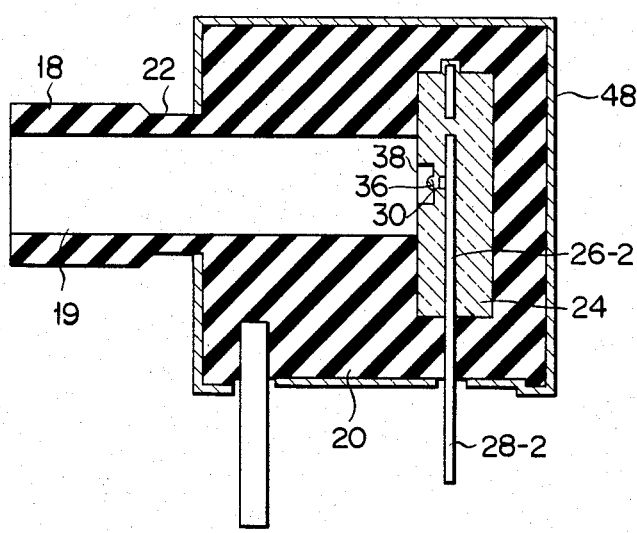

In the embodiment described above, the circuit module plate 24 and the case 20 are separately manufactured. However, the plate 24 may alternatively be mounted to the die in the injection molding of the case 20 to be integrally embedded inside the case 20, as shown in FIG. 6. Furthermore, as shown in FIG. 6, a recess need not be formed in the circuit module plate 24, and the convex lens segment 36 may be formed on the surface of the plate 24 and on the optical axis of the optoelectronic element 30 to project in the hole of the case 20. In this embodiment, a projection 42 is preferably formed so as to project into the hole 19 of the case 20 for positioning the front end of the plug 22. Projection shoulder 42 defines a forward surface 42a, against which the front end of the plug 22 is abutted, and a rearward surface 42b which is in contact with at least a portion of the front face of module plate 24. An annular surface 42c connects forward and rearward surfaces 42a, 42b, respectively, to establish a space into which lens element 36 protrudes. Obviously, dies for molding the case 20 with a cavity of a different shape from that of dies for molding the case 20 as shown in FIG. 3 may be easily manufactured. As shown in FIGS. 7, 8 and 9, the module 6 may have a conductive film 44 for shielding out electromagnetic waves which might adversely affect the elements 30 and 32. This conductive film 44 may be connected to the lead frame 26-2 or the pin 28-2 which is grounded. If the conductive film 44 is not transparent, the plate 24 may be covered with the conductive film 44 except for the region opposing the hole of the socket of the case 20, as shown in FIG. 7. As shown in FIG. 8, the entire outer surface of the plate 24 is covered with the conductive film 44 if the conductive film 44 transmits light. If the plate 24 is not covered with the conductive film 44, the entire outer surface of the case 20 may be covered with a metal material 48 as shown in FIG. 9. Still alternatively, the case 20 itself may consist of a resin material mixed with a metal, and the pins 28-1 to 28-4 may be coated with an insulator. In the modules shown in FIGS. 7, 8 and 9, since the optoelectronic elements 30 and the IC chips 32 are shielded from electromagnetic radiation, the introduction of noise in the signals generated by the modules may be prevented and the S/N ratio may be improved. This shielding from electromagnetic radiation is particularly preferably adopted for the receiver module. The signal obtained by photoelectric conversion at the photodiode is low in level and is amplified and shaped by the IC chip 32. If noise is introduced after such signal processing, the noise is also amplified and transmitted to a circuit of the next stage and this circuit thus receives erroneous information. The shielding from electromagnetic radiation is utilized to prevent this.

Figure 10:
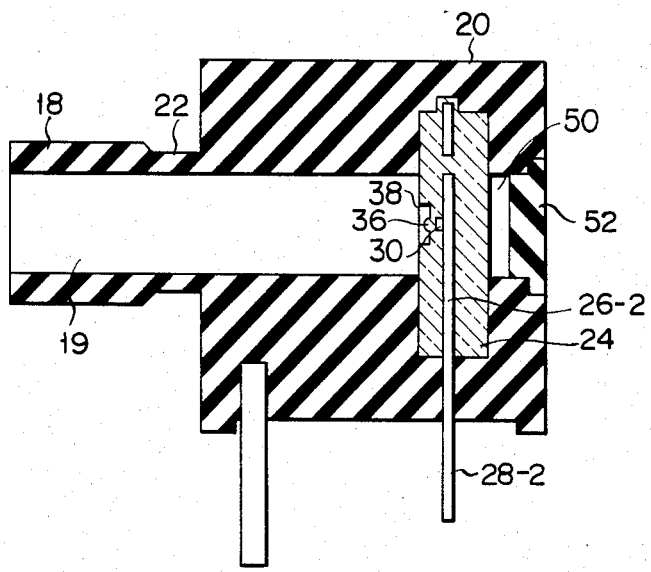
Figure 11:
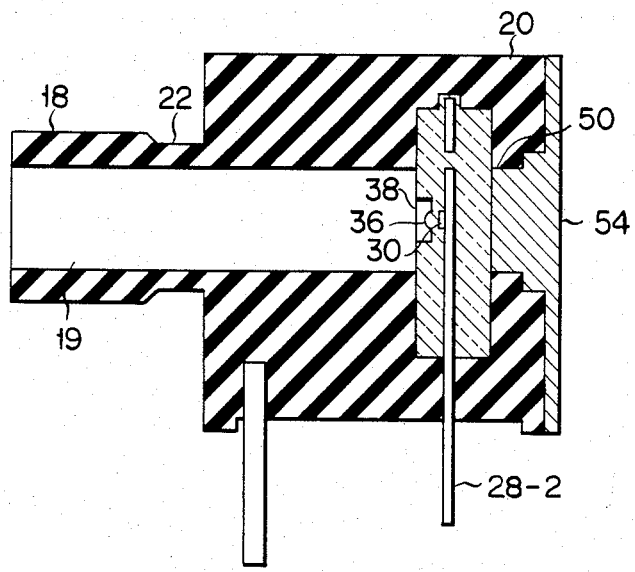

In order to manufacture the module 6 in large quantities and with good precision, the module 6 preferably has a structure as shown in FIGS. 10 and 11. In the module 6 shown in FIGS. 10 and 11, not only the hole 19 extends through the socket 18, but also a hole 50 which is coaxial with the central axis with the hole 19 is formed between the rear surface of the case 20 and the rear surface of the circuit plate 24. This hole 50 may be closed with a simple cap 52 for shielding a light from the outside as shown in FIG. 10. Alternatively, as shown in FIG. 11, the hole 50 may be closed with a heat radiation cap 54 which is adhered to the rear surface of the plate 24 for radiating the heat generated by the optoelectronic element 30 and the IC chip 32 in the plate 24.

The hole 50 as described above is formed because the module 6 is manufactured in the manner to be described below.

Figure 12:
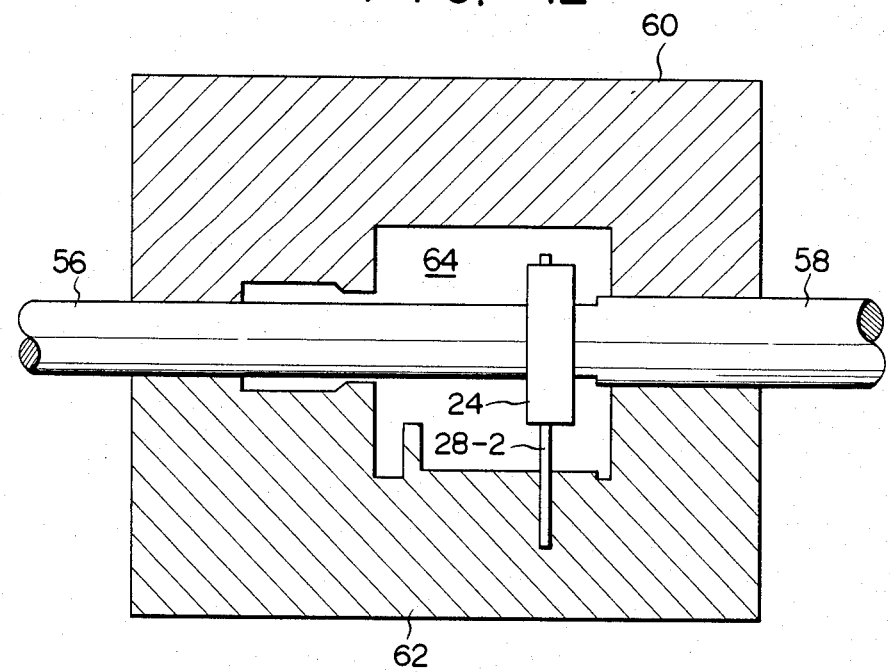
FIG. 12 is a sectional view showing dies for manufacturing the module shown in FIG. 6.

When the circuit plate 24 is manufactured in the manner as described hereinabove, the plate 24 is clamped between the front ends of a pair of die rods 56 and 58 which have outer diameters equal to the inner diameters of the holes 19 and 50. By these die rods 56 and 58, the optical axis of the optoelectronic element 30 of the plate 24 is aligned with the central axis of the die rod 56. Then, dies 60 and 62 are attached as shown in FIG. 12, defining a cavity 64 of a shape conforming to the case 20. Thereafter, as has been described above, a resin is injected into the cavity 64 by injection molding and is cured. After curing, the die rods 56 and 58 are removed, and the dies 60 and 62 are withdrawn. The cap 52 or the radiation cap 54 is covered over the hole 50 formed in the case 20. According to this manufacturing method, the optical axis of the optoelectronic element 30 is aligned with the central axis of the die rod 56, and thereafter the molding takes place. Therefore, after the module 6 is manufactured, the optoelectronic element 30 is correctly aligned with the central axis of the hole 19 of the socket 18 and the case 20.

In summary, according to the module of the present invention, the optoelectronic element such as an LED or a photodiode and the peripheral circuits formed into an IC chip are embedded in a plate-shaped molded body. The case is manufactured in correspondence with this molded body. Therefore, correct alignment may be achieved by simply connecting the fiber optic cable to the module through the connector. Since this manufacturing method is suitable for mass production, the unit price of the module may be reduced.

What we claim is:

1. A module for a fiber optical link of the type mateable with a fiber optic plug connector which terminates at a plug end face, said module comprising:

a body case molded from a light-shielding material and defining an elongated plug hole for receiving the plug connector which is mateable with the module by axial insertion of the plug connector into the plug hole, said body case also defining a hollow space in communication with the plug hole;

a molded member having a front face, said molded member being seated in the hollow space of the body case and being molded from a transparent molding material;

a lens element integrally formed with said molded member at a position in coaxial alignment with said plug hole;

leads embedded in said molded member and extending exteriorly of said body case;

an optoelectronic element mounted on one of the leads embedded in the molded member in a coaxially aligned position with said lens element and said plug hole; and protection means, integral with said molded member, for protecting said lens element by preventing contact between said lens element and said plug end face when the plug connector is mated with said plug hole, said portection means including space-defining means for defining a space which is recessed into said molded member rearwardly of said flat face and coaxially disposed relative to said plug hole, said lens element being extended forwardly into said space towards said plug hole, said space-defining means establishing, at said flat face, a contact surface peripherally of said recessed surface against which said plug end face bears when said plug connector is mated with said plug hole whereby contact between said plug end face and said lens element is prevented.

2. A module according to claim 1, wherein an IC chip is mounted on one of said leads in said member and is electrically connected to said optoelectronic element and said leads.

3. A module according to claim 1, wherein said optoelectronic element comprises an LED.

4. A module according to claim 1, wherein said optoelectronic element comprises a photodiode.

5. A module according to claim 1, wherein the body case has a projection into which the plug hole is extended.

6. A module according to claim 1, wherein said body case has a hole which is coaxial with the plug hole and an outer opening of which is closed with a cap.

7. A module according to claim 1, wherein the molded member is made of a transfer molding material.

8. A module according to claim 1, wherein the body case is made of an injection molding material.

9. A module according to claim 1, wherein the molded member is formed into a cylindrical member.

10. A module for a fiber optical link of the type mateable with a fiber optic plug connector which terminates at a plug end face, said module comprising:

a body case molded from a light-shielding material and defining an elongated plug hole for receiving the plug connector and a hollow space in communication with the plug hole;

a molded member having a front face and being seated in said hollow space, said molded member being molded from a transparent molding material;

a lens element integrally formed with said molded member at a position in coaxial alignment with said plug hole, leads embedded in said molded member and extending exteriorly of said body case;

an optoelectronic element mounted on one of the leads and embedded in the molded member so as to be in an axially aligned position with both said plug hole and said lens element; and protection means disposed in said plug hole for protecting said lens element by preventing contact between said lens element and said plug end face when said plug connector is mated in said plug hole, said protection means including means defining a shoulder which is integral with said body case and which protrudes into said plug hole, said shoulder including (a) a forward surface against which said plug end face bears when said plug connector is mated with said plug hole, (b) a rearward surface in contact with at least a portion of said front face of said molded member, and (c) an annular surface connecting said forward and rearward surfaces and defining an annular space which is coaxially disposed between said lens element and said plug hole, said lens element being forwardly extended into said annular space towards said plug hole such that said annular surface laterally surrounds said lens element, whereby said shoulder prevents contact between said plug end face and said lens element to thereby protect said lens element.

11. A fiber optic link comprising, in combination, (a) an elongated plug connector which terminates at a plug end face, and (b) a module coupled to said plug connector, wherein said module includes:

a body case molded from a light-shielding material and defining an elongated plug hole which is mated with a portion of said plug connector by axial insertion of said plug connector into said plug hole, said body case also defining a hollow space in communication with said plug hole;

a molded member having a front face and seated in said hollow space of said body case, said molded member being molded from a transparent molding material;

a lens element integrally formed with said molded member in coaxial alignment with said plug hole;

leads embedded in said molded member and extending exteriorly of said body case;

an optoelectronic element mounted on one of the leads embedded in said molded member in a coaxially aligned position with said lens element and said plug hole; and protection means, integral with said molded member, for protecting said lens element by preventing contact between said lens element and said plug end face, said protection means including space-defining means for defining a space which is recessed into said molded member rearwardly of said flat face and coaxially disposed relative to said plug hole, said lens element being extended forwardly into said space towards said plug hole, said space-defining means establishing, at said flat face, a contact surface peripherally of said recessed surface against which said plug end face bears whereby contact between said plug end face and said lens element is prevented.

12. A fiber optic link comprising, in combination, (a) an elongated plug connector which terminates at a plug end face, and (b) a module coupled to said plug connector, wherein said module includes:

a body case molded from a light-shielding material and defining an elongated plug hole which is mated with a portion of said plug connector by axial insertion of said plug connector into said plug hole, said body case also defining a hollow space in communication with said plug hole;

a molded member having a front face and seated in said hollow space of said body case, said molded member being molded from a transparent molding material;

a lens element integrally formed with said molded member in coaxial alignment with said plug hole;

leads embedded in said molded member and extending exteriorly of said body case;

an optoelectronic element mounted on one of the leads embedded in said molded member in a coaxially aligned position with said lens element and said plug hole; and protection means, disposed in said plug hole between said plug end face and said molded member, for protecting said lens element by preventing contact between said lens element and said plug end face, said protection means including means defining a shoulder which is integral with said body case and which protrudes into said plug hole, said shoulder including (i) a forward surface against which said plug end face bears, (ii) a rearward surface in contact with at least a portion of said front face of said molded member, and (iii) an annular surface connecting said forward and rearward surfaces and defining an annular space which is disposed between said lens element and said plug end face, said lens element being forwardly extended into said space such that said annular surface laterally surrounds said lens element, whereby said shoulder prevents contact between said plug end face and said lens element to thereby protect said lens element.

* * * * *